(12) United States Patent
Sienel

(10) Patent No.: US 8,378,205 B2
(45) Date of Patent: Feb. 19, 2013

(54) THERMOELECTRIC HEAT EXCHANGER

(75) Inventor: Tobias H. Sienel, Easthampton, MA (US)

(73) Assignee: United Technologies Corporation, Hartford, CT (US)

(*) Notice: Subject to any disclaimer, the term of this patent is extended or adjusted under 35 U.S.C. 154(b) by 959 days.

(21) Appl. No.: 11/540,051

(22) Filed: Sep. 29, 2006

(65) Prior Publication Data
US 2008/0083447 A1    Apr. 10, 2008

(51) Int. Cl.
*H01L 35/00* (2006.01)
*H01L 35/34* (2006.01)
*H01L 35/28* (2006.01)
*H01L 35/30* (2006.01)
*H01L 37/00* (2006.01)

(52) U.S. Cl. ......... 136/200; 136/201; 136/203; 136/205

(58) Field of Classification Search .......... 136/200–201, 136/224, 203–205
See application file for complete search history.

(56) References Cited

U.S. PATENT DOCUMENTS

| 2,703,335 | A | * | 3/1955 | Andrus | 136/224 |
|---|---|---|---|---|---|
| 3,006,979 | A | * | 10/1961 | Rich | 136/204 |
| 3,899,359 | A | * | 8/1975 | Stachurski | 136/205 |
| 5,031,689 | A | * | 7/1991 | Jones et al. | 165/185 |
| 5,254,178 | A | | 10/1993 | Yamada et al. | |
| 5,936,192 | A | * | 8/1999 | Tauchi | 136/203 |

OTHER PUBLICATIONS

Extended European Search Report of the European Patent Office in foreign counterpart Application No. 07253885.3, filed Sep. 29, 2006.

* cited by examiner

*Primary Examiner* — Jonathan Johnson
*Assistant Examiner* — Lindsey Bernier
(74) *Attorney, Agent, or Firm* — Kinney & Lange, P.A.

(57) ABSTRACT

A thermoelectric effects materials based energy transduction device, for selectively providing conversions between electrical and thermal energies having interleaved n-type conductivity material layers having thermoelectric effects properties and a first plurality of p-type conductivity material layers each having thermoelectric effects properties. There is a first plurality of passageway structures each being thermally conductive and each having passageways therethrough extending between two sides thereof with such a passageway structure from this first plurality thereof positioned between members of each overlapped pair of succeeding layers.

23 Claims, 6 Drawing Sheets

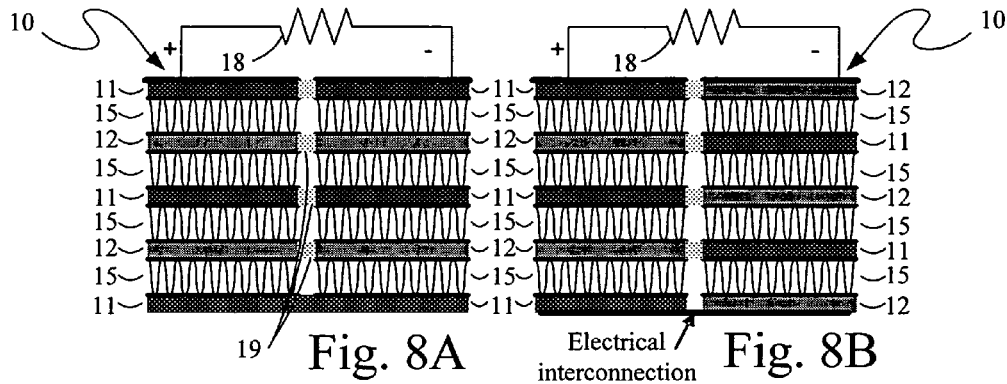
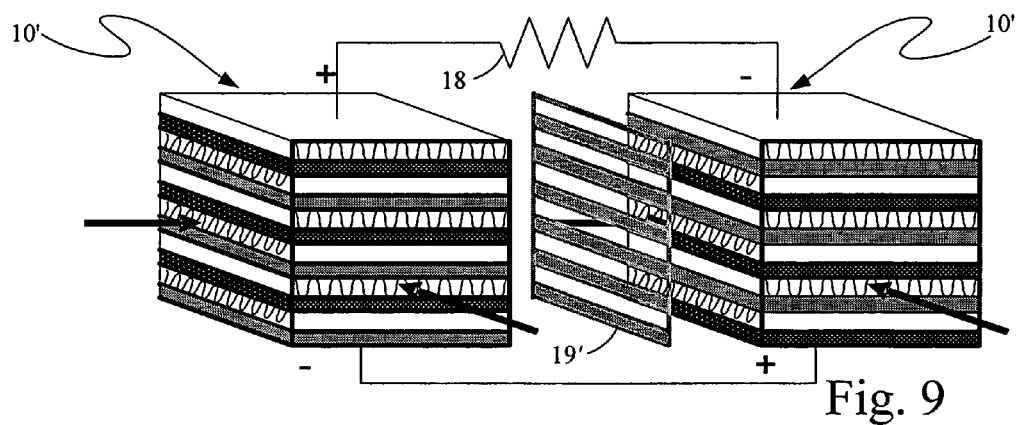
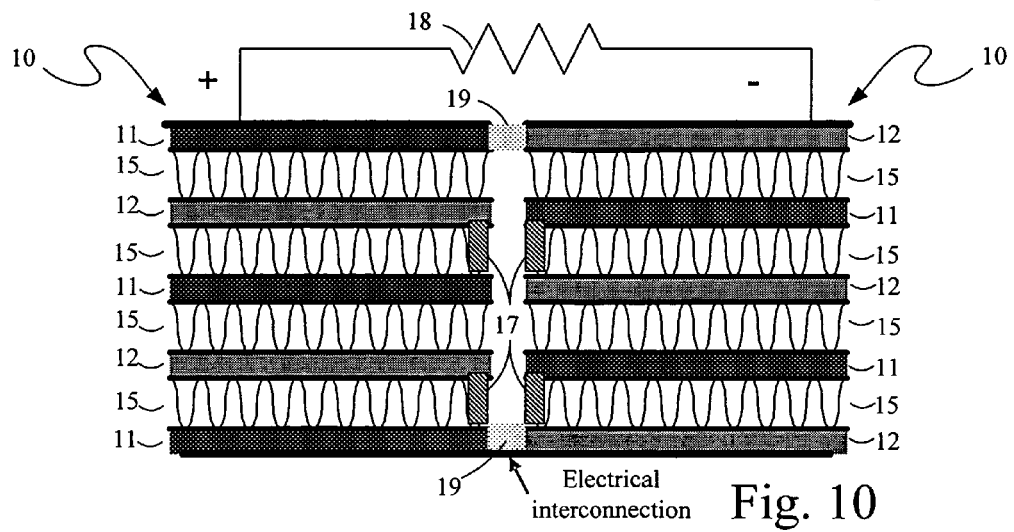

THERMOELECTRIC HEAT EXCHANGER

BACKGROUND OF THE INVENTION

The present invention relates to thermoelectric effects and thermoelectric materials in solid state thermoelectric devices and, more particularly, to the use of such materials with heat exchangers in such devices.

Increasing demand for energy and for transfers of energy is characteristic of modern societies. These trends are likely to continue in view of the ever increasing numbers of consumers, the ensuing increase in the numbers of appliances and vehicles used by those consumers, and the numbers and sizes of business entities supplying same.

Such energy must often be converted from one kind to another in the supplying of that energy or the transferring of that energy. Solid state thermoelectric devices are useful for these purposes as they can convert electrical currents to corresponding thermal gradients (based on the Peltier effect in using an electric potential across a conductive material to attract heat energy carrying charged electrons to one end thereof to provide a thermal gradient). Alternatively, such devices can convert in the reverse, i.e. they can convert thermal gradients to electrical currents (based on the Seebeck effect in using a thermal gradient across a conductive material to diffuse charge carrying electrons to one end thereof to provide an electrical potential).

Solid state thermoelectric devices typically have used a network of alternate conductivity type semiconductor or semimetal material elements interconnected at junctions in a single layer to provide electrical power generation, cooling or heating. These devices have typically had n-type conductivity and p-type conductivity semiconductor or semimetal material elements positioned alternately one after the other in a single row in the layer and which are electrically interconnected from one to the next by metal electrodes. In one such device, these electrodes are positioned extending parallel to the layer at the two layer major surfaces such that a first layer side electrode connects a first n-type conductivity material element to the second p-type conductivity material element that is the next succeeding element in the row. A succeeding electrode on a second, and opposite, layer side connects this succeeding second p-type conductivity material element to a third, and the next succeeding, n-type conductivity material electrode. This electrode interconnection pattern continues across the row between the ends thereof, and further, the first layer side electrodes are also thermally coupled to a hot fluid with the second layer side electrodes being also thermally coupled to a cold fluid.

There are several difficulties with this arrangement. First, providing the precise placement and interconnection of each of the semiconductor elements of the device in the layer row is relatively time consuming and expensive. Secondly, each of the mechanical junctions needed in providing the thermal couplings from the layer row to the fluids provides a contact resistance which results in a decrease in heat transfer effectiveness. Between the hot fluid and the cold fluid there are typically six such junctions in the foregoing system to provide the necessary electrical isolation and thermal coupling. Additionally, the heat transfer area is limited to being just on the two sides of the single layer in which the row is provided.

In another such device, these electrodes are positioned perpendicular to the layer at the layer surfaces between adjacent, succeeding ones of the n-type conductivity and p-type conductivity semiconductor material elements that are positioned alternately one after the other in the single row in the layer. Electrodes between a n-type conductivity material element succeeded by a p-type conductivity material element extend outwardly through, and perpendicular to, the first layer surface to form a fluid channel structure to be thermally coupled to a cold fluid. Similarly, electrodes between a p-type conductivity material element succeeded by a n-type conductivity material element extend outwardly through, and perpendicular to, the second layer surface to form a fluid channel structure to be thermally coupled to a hot fluid. Again, providing the precise placement and interconnection of each of the semiconductor elements of the device in the row layer with such electrodes between them is relatively time consuming and expensive, and again, the heat transfer area is limited to being just on the two sides of the single layer in which the row is provided. Thus, there is desired thermoelectric material based energy conversion devices that are of relatively simple construction and capable of being scaled to convert energy in various quantities including relatively large quantities thereof.

BRIEF SUMMARY OF THE INVENTION

The present invention provides a thermoelectric effects materials based energy transduction device, for selectively providing conversions between electrical and thermal energies, and has both a first plurality of n-type layers each formed of n-type electrical conductivity material with each having thermoelectric effects properties, and a first plurality of p-type layers each formed of p-type electrical conductivity material and each having thermoelectric effects properties. The first plurality of p-type layers is interleaved in spatial positions with the first plurality of n-type layers along a spatial curve to form a first spatial position sequence of these layers. In addition, there is a first plurality of passageway structures each being thermally conductive and each having passageways therethrough extending between two sides thereof. There is a passageway structure from this first plurality thereof positioned between members of each overlapped pair of succeeding layers in the first spatial position sequence thereof such that either the passageway structures in the first plurality thereof are each electrically conductive and are each in electrical contact with that n-type layer and that p-type layer between which that passageway structure is positioned, or that each is in thermal contact with that n-type layer and that p-type layer between which the passageway structure is positioned without being in electrical contact with either. Instead, in this latter instance, a plurality of interconnection conductors is provided with each being adjacent to a corresponding passageway structure in the plurality thereof and in electrical contact with that n-type layer and that p-type layer between which that passageway structure is positioned without those layers being in electrical contact with that passageway structure. The passageways through each of the plurality of passageway structures either extend in directions parallel to one another, or the passageways through some of the plurality of passageway structures extend in directions perpendicular to the directions of extent of the passageways through at least one other of the plurality of passageway structures, and a user forces fluid through them while having electrically connecting a selected one of an electrical energy source and an electrical power dissipating load between a pair of electrodes with the sequence also electrically connected therebetween.

BRIEF DESCRIPTION OF THE DRAWINGS

FIG. 9 shows a perspective view of an improvement of the embodiment shown in FIG. 6, FIG. 10 shows a side view of an improvement of the embodiment shown in FIG. 6, FIGS. 11A and 11B are graphs showing plots of a parameter for various materials over temperature.

DETAILED DESCRIPTION

Figure 1:
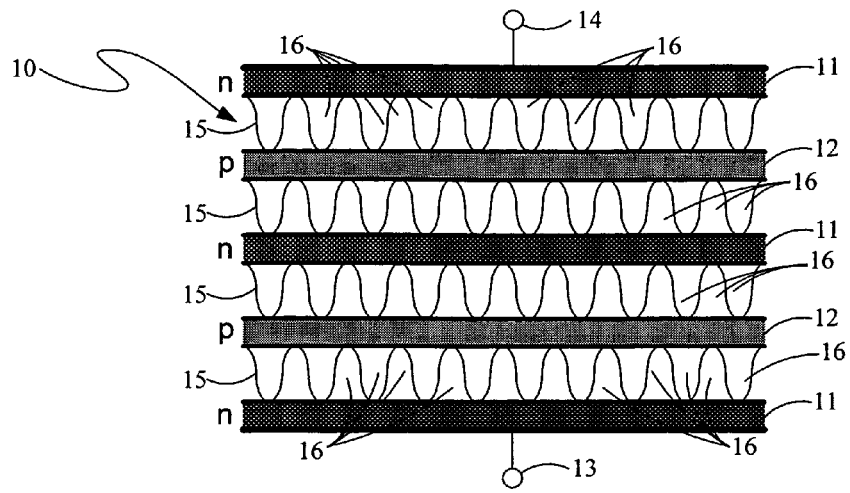
FIG. 1 shows a side view of a layer diagram that represents an embodiment of the present invention.

The present invention, as shown in part in the layer diagram side view thereof in FIG. 1, is a thermoelectric heat exchanger device, 10, for using thermal energy therein to generate electrical power or for using electrical power therein to provide cooling or heating, or both, depending on the materials used in the structure and the electrical currents or thermal gradients applied therein. Thermoelectric heat exchanger device 10 is formed of a succession of semiconductor or semimetal material layers provided therein in a spatial position sequence of alternating electrical conductivity types, p and n types, this spatial sequence of layers being distributed along a spatial curve, typically a line. Succeeding pairs of layers, each of a different conductivity type, are electrically interconnected to one another by a corresponding one of a plurality of electrical conductors positioned therebetween but are also spatially separated from one another by a corresponding one of a plurality of fluid flow accommodating structures each having fluid flow passageways provided therein extending between opposite sides thereof.

Thus, device 10 in FIG. 1 has therein members of a plurality of n-type conductivity semiconductor or semimetal material layers, 11, interleaved with members of a plurality of p-type semiconductor or semimetal material layers, 12, in a spatial position sequence thereof shown in FIG. 1 distributed along a vertical axis (not shown) in that figure, and has an electrode, 13, of one electrical polarity, positive or negative, connected to a layer 11 at one end of the layer sequence and another electrode, 14, of a corresponding opposite electrical polarity connected to another layer 11 at the other end of the layer sequence. Each adjacent pair of layers in this layer sequence in device 10, has one pair member being of n-type conductivity semiconductor or semimetal material layers 11 and the other member being of p-type semiconductor or semimetal material layers 12, and has those members thereof separated from one another by a corresponding one of a plurality, or set, of passageway structure, 15, positioned therebetween.

Thus, there is a passageway structure 15 between each succeeding overlapped pair of layers 11 and 12, i.e. succeeding overlapped pairs of layers are formed from adjacent layers 11 and 12 as the first pair and the succeeding second pair is formed from one of those layers in the first pair and the next layer adjacent thereto. This results in a succession of structures 15 that are also distributed in a passageway spatial position sequence along the vertical axis interleaved with the layer sequence. Structures 15 each have passageways, 16, therein extending therethrough from one side of that structure to the opposite side thereof to accommodate fluid flows therethrough. Altogether, the interleaved sequence of layers 11 and 12, as interleaved by passageway structures 15, complete a "stack" arrangement for thermoelectric heat exchanger device 10 along the unshown vertical axis in FIG. 1.

In device 10 of FIG. 1, electrical interconnections between adjacent ones of n-type conductivity material layers 11 and p-type conductivity material layers 12 in the interleaved sequence thereof is provided by the electrically conductive material, typically a metal, used in forming the corresponding passageway structure 15 positioned therebetween that is also electrically connected to each of those adjacent layers. In addition, this metal in that passageway structure is also thermally conductive to thereby serve as a heat exchanger which can either absorb heat from, or reject heat to, any fluids caused by the user to flow in passageways 16 in the structure and to conduct such heat to, or from, the adjacent ones of n-type conductivity material layers 11 and p-type conductivity material layers 12 in the sequence thereof. Thus, passageway structures 15 are both thermally and electrically conductive in this device for both providing conduits for fluids to be transported therethrough and providing pathways for transporting charge carriers therethrough.

If thermoelectric heat exchanger device 10 of FIG. 1 is to be used as a fluid thermal energy operated electrical power generator, a relatively cold fluid is arranged by the user to be forced through passageways 16 in every other one of the set of passageway structures 15 in the "stack" arrangement in that device, and so those structures serve as the cold flow subset of the set of passageway structures 15. Thus, there is one of the cold flow passageway structures between each nonoverlapped pair of layers 11 and 12 in the layer sequence thereof where succeeding nonoverlapped pairs of layers are formed from a pair of adjacent layers 11 and 12 as the first pair and the succeeding second pair is formed from the succeeding pair of layers 11 and 12 in the layer sequence thereof. A relatively hot fluid is also arranged by the user to be forced through passageways 16 of the remaining ones of the set of passageway structures 15 to thereby serve as the hot flow subset thereof so that one of them is between each of the nonoverlapped pairs of layers 11 and 12 having a cold flow passageway between them. Thus, the subset of hot flow passageways 15 are interleaved with the cold flow subset so as to have one of layers 11 or 12 between succeeding ones of cold flow and hot flow structures in the "stack" arrangement of device 10 to thereby provide a thermal gradient across that layer which in turn forces a voltage potential to arise across that layer as heat carriers with electrical charge are forced down the thermal gradient.

These layer voltage differentials in device 10 combine to yield one of two opposite electrical polarity possibilities at electrodes 13 and 14. That is, one of these electrodes will be positive with respect to the other as the voltage potential developed across each of layers 11 and 12, due to the thermal gradients thereacross resulting from the forced fluid flows, and these layer potentials add together through the electrically interconnected members forming the "stack" arrangement. If the cold flow subset of passageway structures 15 have the fluid flows therein switched to become hot fluid flows, and so then the hot fluid subset, and correspondingly, the initial hot flow subset of passageway structures 15 have the fluid flows therein switched to become cold fluid flows, and so then the cold fluid subset, the electrical polarity situation at electrodes 13 and 14 will be then reversed from that present before such fluid flows switching to thereby have the opposite polarity from that occurring prior to such switching of flows.

An alternative use in which heat exchanger device 10 of FIG. 1 can be employed as an electrical energy operated heating or cooling device, or both. In this use, one of the two opposite electrical polarity possibilities at device electrodes 13 and 14 is maintained by the user, that is, one of the electrodes is maintained positive with respect to the other by application of an electrical energization source such as a voltage supply. Fluids arranged by the user to be forced through one subset of every other one of the set of passageway structures 15 in the "stack" arrangement therein become relatively cold as charge carriers with thermal energy are removed from nearby these passageways by the resulting electrical current. This subset thereby becomes the cold flow subset of the set of passageway structures 15 with each member between a succeeding pair of nonoverlapped layers 11 and 12.

Concurrently, fluids arranged by the user to be forced through the subset of the remaining ones of passageway structures 15 interleaved with the cold flow ones in the "stack" arrangement become relatively hot. Thereby, these structures thereby become the hot flow subset of the set of passageway structures 15 in the "stack" arrangement therein as charge carriers with thermal energy are moved near to these passageways by the same resulting electrical current. There is a member of the hot flow subset between each of the nonoverlapped pairs of layers 11 and 12 having a cold flow passageway between them. If the electrical polarity of the electrical potential at electrodes 13 and 14 is reversed, the initial cold flow subset of passageway structures 15 have the fluid flows therein become relatively hot, and so are switched to then become the hot fluid flow subset, and correspondingly, the initial hot flow subset of passageway structures 15 have the fluid flows therein switched to become relatively cold and so are switched to then become cold fluid flow subset.

The set of passageway structures 15 shown in FIG. 1 are each shown there formed as a corrugated metal sheet having two further planar metal sheets attached thereto at the opposite extremes of the corrugations therein so as to have one such planar sheet on either side thereof. This structural arrangement is shown used in both the hot fluid flow passageway structures and the cold fluid flow passageway structures in device 10.

However, any suitable kind of heat exchanging passageway structure can be used to provide a passageway structure 15 in thermoelectric heat exchanger devices 10 as an alternative to this corrugated metal sheet "sandwich" structure including having different kinds of heat exchanging passageway structures used for structures 15 in a single device 10. These alternative heat exchanging passageway structures for thermoelectric heat exchanger devices 10 include, but are not limited to, straight sided metal walls perpendicularly positioned with respect to the two planar metal sheets in place of the sides of the corrugated sheet, lanced walls, pipes embedded in a metal matrix, metal foam structures, microchannel structures, minichannel structures, or the like. The choice of which of the various alternative structural forms (and the kind of structural materials used in the construction thereof) is appropriate in a thermoelectric heat exchanger device 10 for passageway structures 15 therein typically depends on the kinds of fluids chosen to flow in passageways 16 therein as well as the most efficient or economical method of construction. For example, there can be advantages to having passageways 16 with relatively longer separation distances between layers 11 and 12 in either side thereof for a fluid flow that is a hot vapor but having relatively shorter passageway cross section separation distances for a fluid flow that is a liquid flow. This is due to the density differences between liquid and vapor flows which dictate larger passageway 16 cross section areas for less dense flows in order to avoid excessively large pressure drops in attempting to force more vapor through passageways 16 to transport sufficient heat.

As indicated above, since the material used to form passageway structures 15 is to be electrically and thermally conductive, metals will be typically used as the structural materials including, but not limited to, steel, copper and aluminum as well as specialized materials such as stainless steels and alloys such as Inconels, Hastalloys and Hanes alloys. Thus, a high temperature optimized material such as an Inconel or Haynes alloy might be chosen as the structural material for the hot fluid flow passageway structures 15 described above if the fluid temperature is sufficiently large while aluminum may might be chosen as the structural material for the cold fluid flow passageway structures 15 also described above, i.e. different kinds of materials may be used for forming different ones of passageway structures 15 in a single thermoelectric heat exchanger device 10.

Passageway structures 15 in FIG. 1 each have those passageways 16 therein extending parallel to those of the others so as to permit fluid flows therein to be established to have a common flow direction parallel to one another. Alternatively, the fluid flows can be established in passageways 16 of structures 15 of a thermoelectric heat exchanger devices 10 to be parallel in one direction in some of passageways 16 in a structure 15 but with some flows in other passageways 16 of that structure 15 established in the opposite or antiparallel direction, so as to have fluids in counterflows therein. Similarly, fluid flows can be established to be flowing parallel in one direction in passageways 16 in each of some of structures 15 but established in the opposite or antiparallel direction in passageways 16 in others of structures 15 to have counterflows established in different ones of structures 15 with respect to one another. Although such arrangements may be particularly advantageous for heat transfer efficiency reasons, the construction of manifolds connecting sources and sinks of such parallel flows or counterflows to the corresponding ones of, or parts of, passageway structures 15 may be more complex or more expensive or both because of being limited to being positioned on just two sides of the "stack" arrangement.

In such circumstances, a simpler or more economical, or both, arrangement for passageway structures 15 in the "stack" arrangement in thermoelectric heat exchanger device 10 can be to have passageways 16 in some passageway structures 15 extend along a flow direction perpendicular to the flow direction followed by passageways 16 in others of passageway structures 15, that is, to have fluids established in crossflows in different ones of structures 15 with respect to one another. This allows the manifolds connecting sources and sinks of such crossflows in one direction to be positioned on two sides of the "stack" perpendicular thereto, and also allows the manifolds connecting sources and sinks of such crossflows in the perpendicular direction be positioned on two other sides of the "stack" arrangement perpendicular to that crossflow direction.

Figure 2:
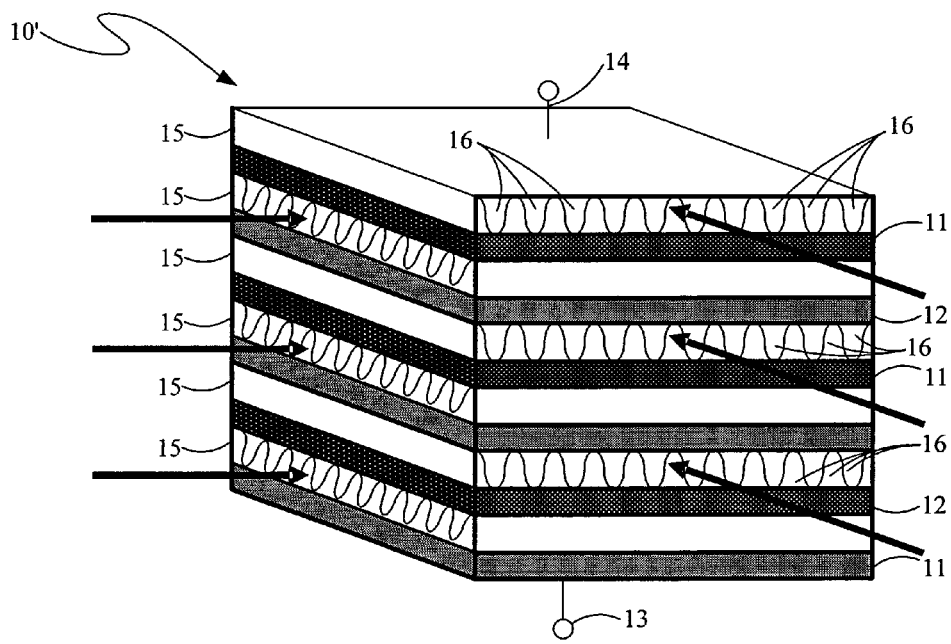
FIG. 2 shows a side view of a layer diagram that represents an alternative embodiment of the present invention.

One such passageway structures arrangement is shown in the perspective layer diagram side view of an alternative thermoelectric heat exchanger device, 10', in FIG. 2 where every other one of the spatial position sequence of passageway structures 15 in the "stack" arrangement of device 10' shown there has those passageways 16 therein extend in one direction parallel to one another and the remaining ones in the set of structures 15 has those passageways 16 therein extend parallel to one another in a direction perpendicular to the first. The same numerical designations are used in FIG. 2 as were used in FIG. 1 for similar structure portions. Large bolded arrows show intended fluid flow directions in FIG. 2

Figure 3:
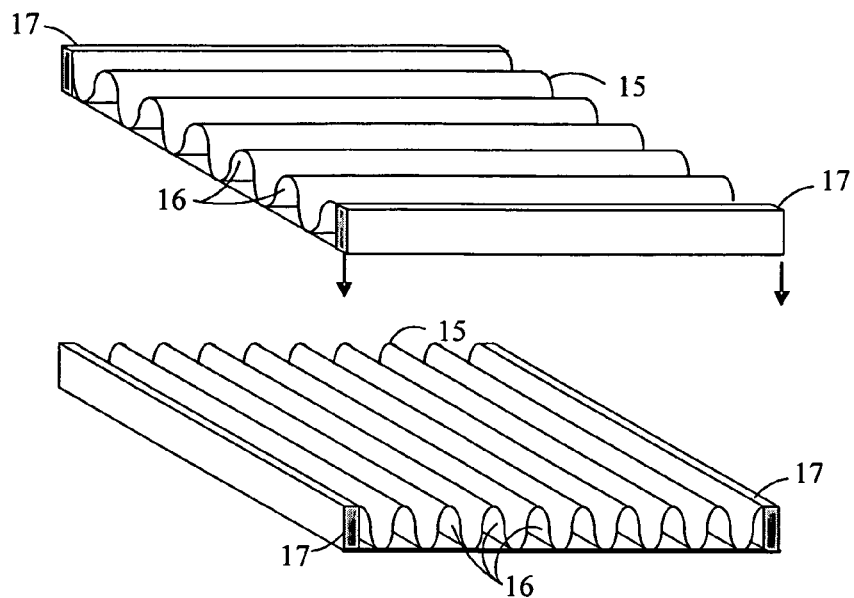
FIG. 3 shows a perspective cutaway view of an improvement of a portion of the embodiment shown in FIG. 2.

The sides of the outer ones of passageways 16 in passageway structures 15, if desired not to be ended simply by the nearest respective corrugated metal sheet end side, can, instead, have endplates, or closure bars, provided thereat. These bars serve to close off these outer passageway 16 portions in those structures to thereby prevent any fluid flowing therein in one passageway structure 15 from leaking into the fluid flow of another of passageway structures 15. One form of such a structural arrangement is indicated in the perspective, cutaway view of FIG. 3. A corrugated sheet in one of passageway structures 15 has its corrugations extending along one direction and is attached to a planar metal sheet on one side thereof at the extremes of the corrugations on that side (the other planar metal sheet for the other side being omitted for clarity) with the outer ones of passageways 16 formed by the corrugations in the corrugated sheet being closed off by a corresponding one of a pair of closure bars, 17. The next succeeding one of passageway structures 15 shown has its corrugations extending along a direction perpendicular to that of the first described corrugated sheet and is also attached to a planar metal sheet on one side thereof at the extremes of the corrugations (again with the other planar metal sheet for the other side being omitted for clarity). Here, too, the outer ones of passageways 16 formed by the corrugations in this last corrugated sheet are closed off by corresponding ones of another pair of closure bars 17.

Figure 4:
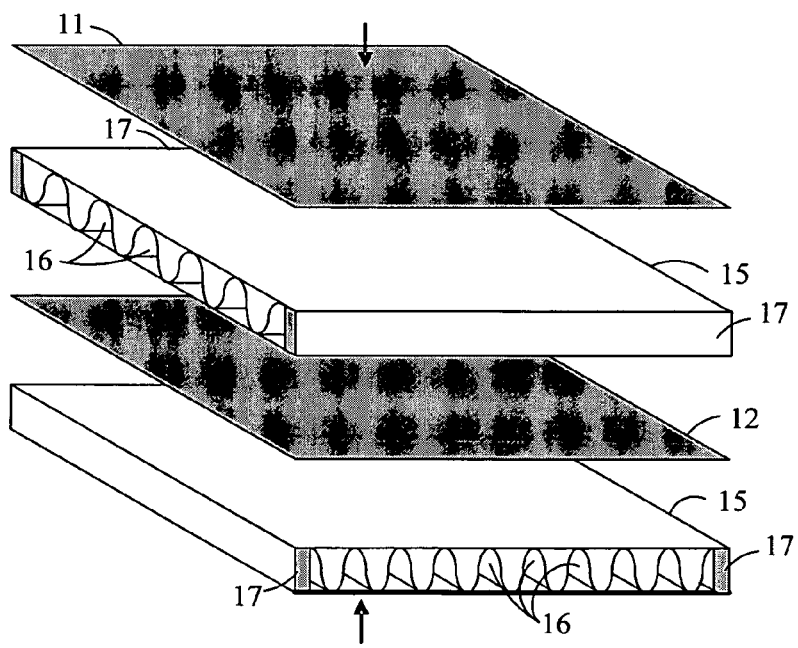
FIG. 4 shows a perspective exploded view of an embodiment shown in FIGS. 2 and 3.

One possible method out of many possible methods of manufacturing thermoelectric heat exchanger devices 10 is to form passageway structures 15 for such a device first, and then bond one of these structures so formed to each of the n-type conductivity material layers 11 and p-type conductivity material layers 12 in a adjacent pair thereof as indicated in the perspective exploded view of FIG. 4. Thus, for example, a "sandwich" of a corrugated of metal material is positioned between two flat sheets of metal material which are each welded or brazed to the corrugated sheet at the opposite extremes of the corrugations therein so as to have one such planar sheet on either side thereof. The application of braze material to either the corrugation extremes, or to the corrugations attachment positions on the flat sheets prior to assembly followed by processing the assembly in a braze furnace is a suitable metal joining procedure for this manufacture. This method of manufacture has the advantage of not exposing the materials of layers 11 and 12 to the potentially high temperatures of the brazing, or other bonding, process joining the parts of passageway structures 15 while also allowing for selecting among various alternatives for layers 11 and 12 and among various alternatives for the hot and cold subsets of passageway structures 15.

After the passageway structures 15 have been constructed, layers 11 and 12 can be bonded to them such as by brazing or by the use of a liquid metal at the bonding interface without brazing. The use of liquid metals has the advantage of eliminating consequences of the mismatch of the coefficient of thermal expansion between the materials of passageway structures 15 and those of the materials in layers 11 and 12. The disadvantage, however, is that this method will require the use of a mechanical clamp to hold the "stack" arrangement in device 10 together indicated by the opposed bolded arrows in FIG. 4 at opposite ends of the portion of the "stack" shown there. Depending on the choice of electrical isolating passageway structures 15 (to be described below), the clamping structure may need to be electrically isolated from structures 15 to prevent electrical short circuits from occurring.

In operation of devices 10 or 10' as thermoelectric effects based electrical power generators, relatively hot fluids are arranged by the user to flow in a hot flow passageway structures 15 each of which exchanges heat with the structure in which it flows which structure, in turn, transmits that heat though the metal sheets of the structure to the n-type conductivity material layer 11 through the junction that layer makes with that structure on one side thereof and to the p-type conductivity material layer 12 through the junction that layer makes with that structure on the other side thereof. On the other side of each of layers 11 and 12, there are junctions between those layers and corresponding cold flow passageway structures 15 in which relatively cold fluids are arranged by the user to flow. The resulting temperature differential, or gradient, across n-type conductivity material layer 11 and the resulting temperature differential, or gradient, across p-type conductivity material layer 12 produce, as indicated above, a voltage difference across these two layers. The value of this voltage difference will depend on the value of the temperature differentials and the kinds of materials chosen for each of layers 11 and 12.

Figure 5:
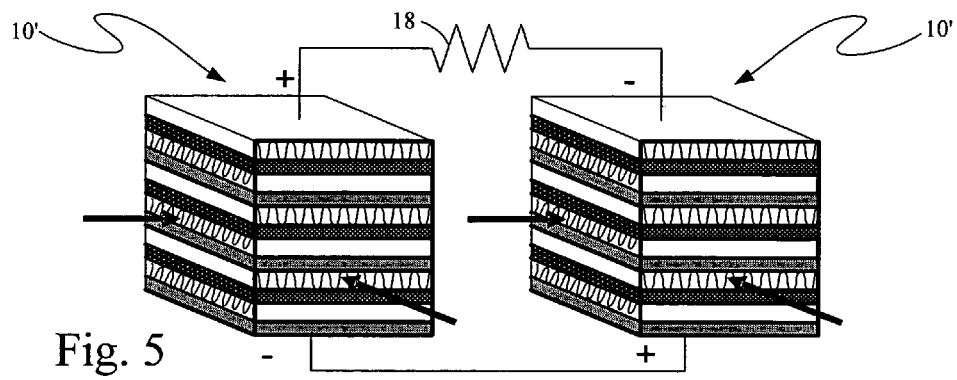
FIG. 5 shows a perspective view of an embodiment of the present invention based on a combination of a plurality of the embodiments shown in FIG. 2.

The total voltage difference occurring between the terminals 13 and 14 of thermoelectric heat exchanger devices 10 or 10' increases directly with the numbers of layers 11 and 12 present in the "stack" of that device as they are electrically interconnected in series by electrically conductive passageway structures 15 positioned therebetween. Thus, devices 10 or 10' can be configured to have a selected voltage at least approximately appear between terminals 13 and 14 thereof through selecting suitable numbers of layers 11 and 12 to be present in the "stack" therein. Typically, various practical reasons tend to limit the of layers 11 and 12 that can be present in the "stack", and also the areal extent of such layers. Thus, to reach greater voltage difference values, two or more of thermoelectric heat exchanger devices 10 or 10' can be electrically interconnected in series but otherwise electrically isolated from one another to thereby increase the total voltage difference between the electrodes at the ends of the series interconnected devices. Such an arrangement is shown schematically in the perspective layer diagram view in FIG. 5 where two of thermoelectric heat exchanger devices 10' are interconnected in series with one another to together be across an electrical load dissipating at least some electrical power represented as an impedance, 18, with these devices indicated there to be otherwise electrically isolated from one another. However, although not shown, the cold flow passageway structures 15 of one of crossflow devices 10' can be connected together with the cold flow passageway structures 15 of the other to carry a common fluid flow therethrough, or, for suitable layer sequences, simply be formed as common structure in each device. This is also true for the hot flow passageway structures 15 of these devices.

Figure 6:
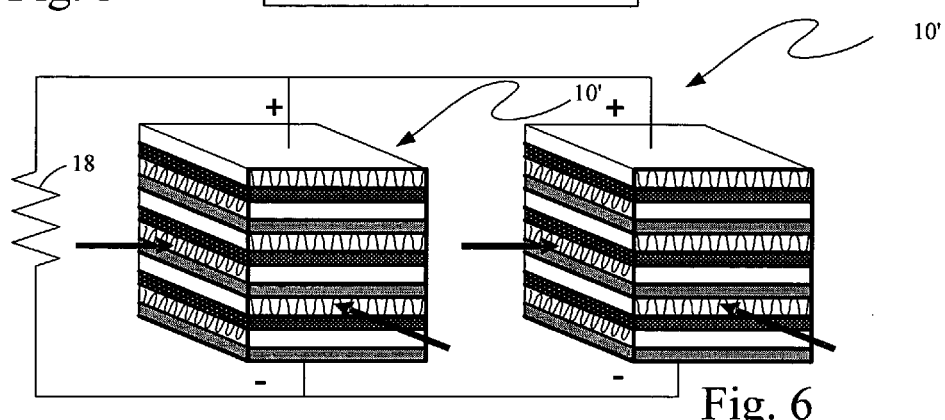
FIG. 6 shows a perspective view of an embodiment of the present invention based on an alternative combination of a plurality of the embodiments shown in FIG. 2.

The electrical power available from such devices also can be increased at a selected voltage difference through having two or more of thermoelectric heat exchanger devices 10 or 10' electrically interconnected in parallel but otherwise electrically isolated from one another. An arrangement of this sort shown schematically in the perspective layer diagram view in FIG. 6 where two of thermoelectric heat exchanger devices 10' are interconnected in parallel with one another and each across electrical load 18 with these devices indicated there to be otherwise electrically isolated from one another. Again, however, although not shown, the cold flow passageway structures 15 of one of crossflow devices 10' can be connected together to carry a common fluid flow therethrough, or simply be formed as common structure in each device, as is also true for the hot flow passageway structures 15 of these devices.

Figure 7:
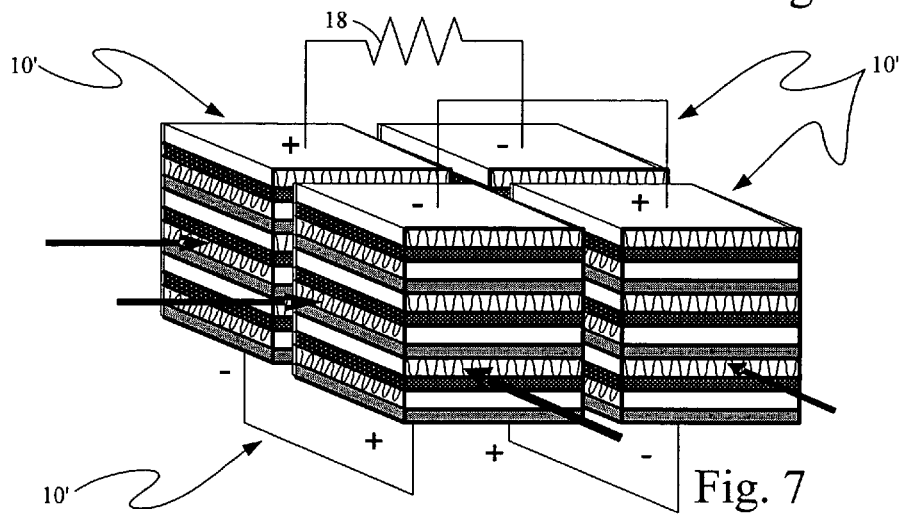
FIG. 7 shows a perspective view of an embodiment of the present invention based on a further alternative combination of a plurality of the embodiments shown in FIG. 2, FIGS. 8A and 8B show side views of improvements of the embodiment shown in FIG. 6.

Arrangements of thermoelectric heat exchanger devices 10 or 10' can be provided having multiple parallel and series connected devices therein depending on the design objectives, materials, and temperatures involved. FIG. 7, for example, shows a perspective layer diagram view of an arrangement of four crossflow devices 10' electrically connected in series with one another to together be across electrical load 18 with these devices again indicated there to be otherwise electrically isolated from one another.

In those arrangements of thermoelectric heat exchanger devices 10 or 10' having multiple parallel or series connected devices therein, or both, the electrical contacts occurring between those devices including the desired electrical interconnections are significant and must be provided, and for some kinds avoided, with care. Each of the devices has different voltage potentials at various locations therein and any electrical connection inside the devices between one another would cause an electrical short circuit. One way to avoid this possibility is to provide for electrical and thermal insulation between each of the layers in adjacent devices 10 as shown in the examples in the side layer diagram views in FIG. 8. Each of the devices shown can be manufactured (brazed or otherwise bonded or clamped) individually and then assembled with the insulating material element, 19, such as a ceramic, added between the layers 11 and 12 in the devices during later assembly to provide such electrical and thermal insulation. In FIG. 8A, the devices are assembled such that the insulation is between pairs of layers 11, and between pairs of layers 12, with one member of each such pair being in each of devices 10. In FIG. 8B, the devices are assembled such that the insulation is between pairs of layers 11 and 12, with one member of each such pair being in each of devices 10. Parallel or counterflow passageway structures 15 can be common to both of devices 10 in the assembly shown in FIG. 8B but not in FIG. 8A which must have cold and hot flow passageway structures at the same level in the "stack" arrangements of the devices.

The insulating material can be manufactured in patterned sheets so that the assemblies can be provided quickly and inexpensively. This is represented schematically in the perspective layer diagram view in FIG. 9 for a patterned insulation sheet, 19', to be positioned between two crossflow devices 10' with horizontal bars in the sheet to be between pairs of layers 11 and 12, one from each device, and openings between the material bars through which passageway structures 15 can extend.

An alternative to the use of insulation between pairs of layers in the assembled devices is to use closure bars 17 to close the sides of a subset of passageway structures 15 transporting therethrough a kind, or kinds, of fluid flows that are not to be mixed with the common kind of fluid flow provided in the remaining subset of passageway structures 15. Such an arrangement is represented schematically in side layer diagram view in FIG. 10 in which again insulation elements 19 are used between the pairs of end layers formed with one layer from each device as electrical and thermal insulators. This allows having those passageway structures 15 without closure bars 17 in that figure that are across the shown intervening space from one another to be extended into single structures.

In operation of devices 10 or 10' as thermoelectric effects based coolers or heaters, or both, the device operating process is essentially reversed from that used for thermoelectric effects based electrical power generators. Instead of the user arranging for cold and hot fluid flows in corresponding ones of passageway structures 15, the user arranges for fluid flows therein at temperatures convenient for the use situation to be forced through passageway structures 15 in a device and applies a voltage potential across the "stack" arrangement in that device at the device electrodes 13 and 14 thereof which, as indicated above, generates a temperature differential, or gradient, across each of layers 11 and 12 in that device "stack" arrangement. In these devices so operated, the fluids flowing in the subset of every other one of passageway structures 15 in a device are heated by the adjacent ones of layers 11 and 12, while the subset of the remaining interleaved ones of passageway structures 15 are cooled by the adjacent ones of layers 11 and 12.

In this use of either devices 10 or 10' for cooling or heating fluids, the more thermally efficient operating method is for the user to arrange for the fluid flows in these two subsets of passageway structures 15 in a device to be counterflows with respect to one another, that is, to use devices 10 for providing such cooling or heating. Since the efficiency of the thermoelectric cooling or heating process is directly proportional to the temperature difference between the hot and cold sides of layers 11 and 12, efficient operation of the device requires minimizing the temperature gradient differences on average across layers 11 and 12. If parallel flows are used in the two subsets of passageway structures 15 in a device so that the fluids flowing in them enter the passageways 16 of each structure 15 on the same side of these subsets to thereby flow in the same direction typically at the same entry temperature, the flows through one subset will rapidly become hotter in traversing those passageways from the entry end to the opposite end and the flows in the other subset will rapidly become colder in traversing their passageways in this same direction. As this happens, the efficiency of device 10 will rapidly decrease as the temperatures of the fluids in succeeding ones of structures 15 in the "stack" arrangement, one from the hot subset followed by one from the cold subset or vice versa, significantly diverge on approaching the ends of passageways 16 opposite the ends of fluid entry therein to thereby substantially increase the temperature gradients in layers 11 an 12 between those succeeding structures near those opposite passageway ends to result in hindering there the thermal energy bearing charge carriers in those layers. The temperature difference is initially relatively low, but rapidly increases along passageways 16 in structures 15 away from the ends of fluid entry therein and so leave device 10 with a relatively small layer temperature gradient in the "stack" arrangement layers on the fluid entry side and a relatively large layer temperature gradient in the "stack" arrangement layers on the fluid exit side.

If, on the other hand, the fluid flows in the cold and hot subsets of passageway structures 15 enter at ends of passageways 16 therein at a side of one subset opposite the side of entry of the other subset to thereby provide a counterflow between these subsets as the fluids therein traverse those passageways in the two subsets in opposite directions, again entering each subset typically at the same temperature, the temperature difference between succeeding ones structures 15, that is, one from the hot subset followed by one from the cold subset or vice versa, will remain relatively consistent along layers 11 an 12 between those succeeding structures. In this way, the average temperature difference across layers 11 and 12 in proceeding from the entrances to the exits of passageways 16 would be minimized to thereby lead to a better overall averaged device performance.

Figure 11A:
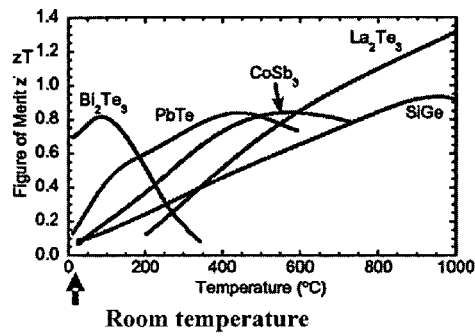
Figure 11B:
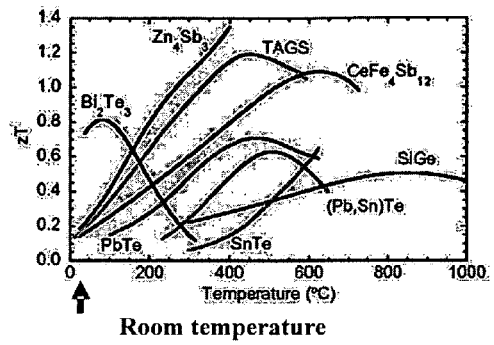

FIG. 11 shows plots of a dimensionless "figure of merit", zT, versus temperature on the Celsius temperature scale for various thermoelectric effect materials in two graphs, one in FIG. 11A for n-type conductivity materials for use in layers 11 and the other graph in FIG. 11B for p-type conductivity materials for use in layers 12. As indicated, the choice of the appropriate material for each of these layers depends in part on the efficiency of the material (zT representing temperature times a ratio of its capability for providing electrical power from heat to its thermal conductivity and its electrical resistivity) at the desired temperatures of device operation.

Layers 11 and 12 in device 10 of FIG. 1 that have relatively large area surfaces may need to each be correspondingly sectioned into corresponding layer sections 11' and 12' when manufactured to, in effect, provide several "stack" arrangements electrically isolated from one another over the one set of passageway structures 15 to be operated by the user selectively as electrical power generators, coolers or heaters. This may be advantageous due to temperature differences between different portions of device 10 as shown in FIG. 1 leading to temperature difference between the "stack" arrangements within the sectioned device structure but smaller than those of the FIG. 1 device. As an example of such temperature differences is the changing layers temperature gradients along passageways 16 described above if the devices are operated as coolers or heaters, and so that the separated "stack" arrangements can each generate therein more consistent and efficient temperature gradients (minimized for cooling or heating or both, for example) since they will extend for much shorter distances along passageways 16.

Figure 12:
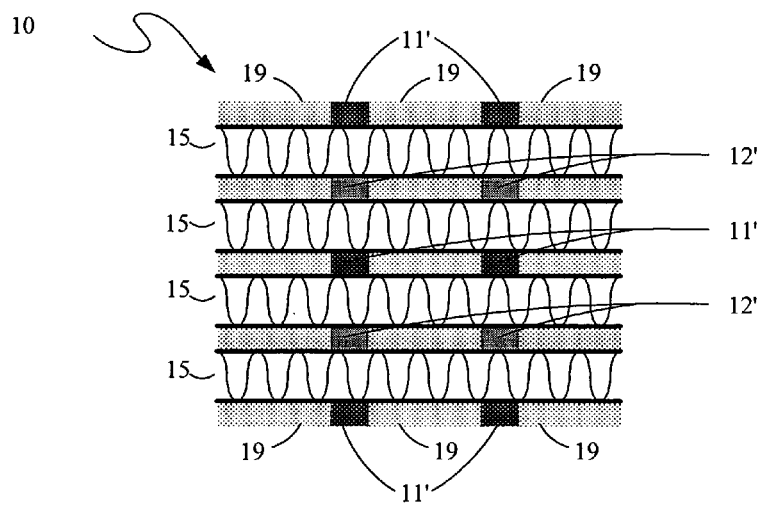
FIG. 12 shows a side view of a layer diagram of an improvement of the embodiment shown in FIG. 1.

Such sectioning of layers 11 and 12 can be arranged, for example, in parallel rows with insulation elements 19 inserted between the resulting layer sections as shown schematically in sectioned structure device 10 in the layer diagram side view of FIG. 12. These elements can be simple pillars (round or square), or they can be strips that run the length of layers 11 and 12 either parallel to or perpendicular to the direction of extent of passageways 16. From a thermal performance perspective, the best arrangement for a sectioned device 10 to be operated as a cooler or heater, or both, would be to have layers 11 and 12 sectioned into rows by insulation elements 19 formed in strips extending perpendicular to the directions of extent of passageways 16 in passageway structures 15, and with fluid flows in the cold flow subset of structures 15 flowing antiparallel to flows in the hot flow subset of structures 15, i.e. in counterflows between heated fluid flows and cooled fluid flows. This would serve to minimize the temperature differences in the segmented rows of layers 11 and 12, and thus maximize the performance of the overall sectioned structure device 10.

Figure 13:
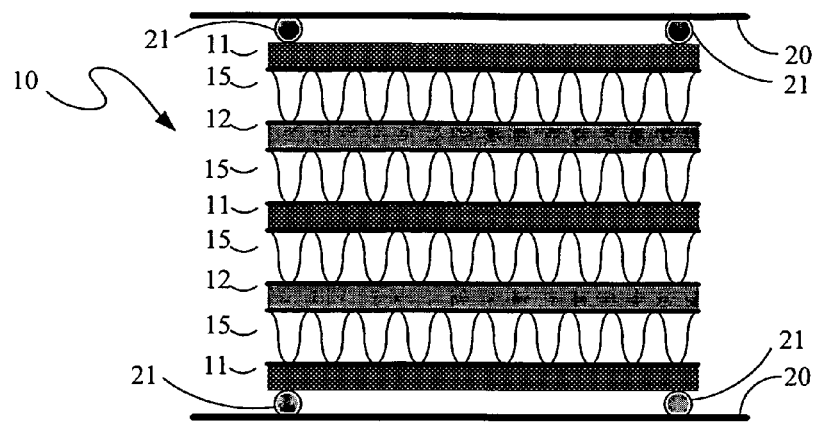
FIG. 13 shows a side cutaway view of a layer diagram of another improvement of the embodiment shown in FIG. 1.

The total voltage difference occurring between the terminals 13 and 14 of thermoelectric heat exchanger devices 10 or 10' is the sum of the voltage differentials formed across layers 11 and 12 present in the "stack" of that device due to thermal or potential gradients impressed thereon because they are electrically interconnected in series by electrically conductive passageway structures 15 positioned therebetween. As such, care must be taken in housing such devices in housing structures with electrically conductive walls as is shown for device 10 represented schematically as being in a housing structure, 20, seen in the cutaway layer diagram and housing side view in FIG. 13. Such conductive walls must not be allowed to come into contact with any portion of so housed devices 10 or 10' to avoid having those walls provide electric short circuits between any potions of the housed devices. Electrical isolators, 21, should be used between such conductive walls of the housing structure to avoid this problem as shown schematically in FIG. 13.

Figure 14:
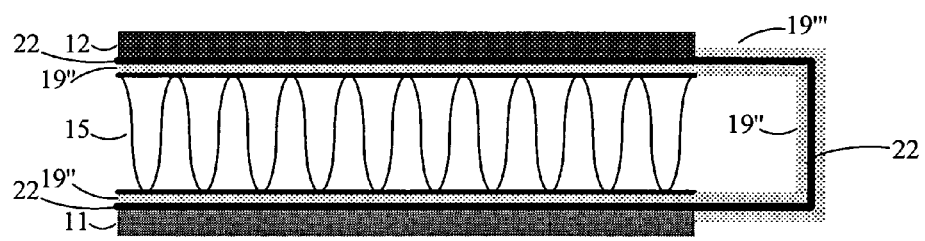
FIG. 14 shows a side view of a layer diagram of a portion of another improvement of the embodiment shown in FIG. 1.

In some circumstances, passageway structures 15 may need to be electrically isolated from adjacent layers 11 and 12 to avoid such shorting risks in electrically conductive housing structures but, of course, those two layers 11 and 12 still have to be electrically interconnected to one another. Another circumstance in which such electrical isolation of structures 15 from adjacent ones of layers 11 and 12 is required comes about if the fluids to be flowed through passageways 16 in structures 15 are electrically conductive fluids sufficiently conductive to provide an unwanted electrical interconnection between different ones of layers 11 and 12 in a device at different voltage values or between such layers in different devices in an assembly thereof to thereby create a short circuit that interrupts proper operation. FIG. 14 shows a layer diagram side view of just one layer 11 and one layer 12 from a "stack" arrangement with a passageway structure positioned therebetween but with this structure electrically isolated from those layers by an electrical insulating, thermally conductive, isolation element, 19'', bonded to that structure and to the inside of a "U" shaped electrical and thermal conductor, 22, typically of metal. Conductor 22 has two parallel "legs" joined at one end thereof to the other by a relatively short "joining" section. Conductor 22 electrically interconnects layers 11 and 12 by electrically contacting each of those layers at the outside of its two parallel "legs". Conductor 22 also has a further electrically insulating element, 19''', bonded to the remaining portions of the outside of its two parallel "legs" and the end "joining" portion thereof so that conductor 22 is thereby electrically isolated from its surroundings other than layers 11 and 12 by insulating elements 19'' and 19''' including being electrically isolated from any fluids flowing thereabout. Although FIG. 14 shows this electrical isolation arrangement schematically with just one passageway structure 15 and its immediately adjacent layers 11 and 12, this arrangement is repeated over each of passageway structures 15 in the set thereof where such electrical isolation is desired.

Although the present invention has been described with reference to preferred embodiments, workers skilled in the art will recognize that changes may be made in form and detail without departing from the spirit and scope of the invention.

The invention claimed is:

1. A thermoelectric effects materials based energy transduction device for selectively providing conversions between electrical and thermal energies, the device comprising:
   a first plurality of n-type layers each formed of n-type electrical conductivity material and each having thermoelectric effects properties;
   a first plurality of p-type layers each formed of p-type electrical conductivity material and each having thermoelectric effects properties, the first plurality of p-type layers being interleaved in spatial positions with the first plurality of n-type layers along a spatial curve to form a first spatial position sequence of these layers; and
   a first plurality of passageway structures each being formed of thermally conductive separators which are adjacent to passageways through the passageway structures, the passageways extending between two sides of the passageway structures, and with a corresponding passageway structure from this first plurality of passageway structures having a separator in that passageway structure extending across the passageway structure so that the separator is positioned between, and in thermal contact with, facing sides of both members of each overlapped pair of succeeding layers in the first spatial position sequence of layers to be in a continuous conductive thermal connection between these succeeding layers and to provide the corresponding passageway structure with passageways extending between the two sides of that structure; the corresponding passageway structure adapted to confine a single flow of fluid through the passageway structure; and a first plurality of electrical conductors with a corresponding electrical conductor from this first plurality of electrical conductors in direct electrical and physical contact with the facing sides of both members of each overlapped pair of succeeding layers in the first spatial position sequence of layers, the sides of both members facing directly across the passageway structure from each other; the first plurality of electrical conductors are the first plurality of passageway structures or a plurality of electrical conductors separate from the first plurality of passageway structures.

2. The device of claim 1 wherein the first plurality electrical conductors are the first plurality of passageway structures.

3. The device of claim 1 wherein the passageway structures in the first plurality thereof are each electrically conductive and are each in thermal contact with that n-type layer and that p-type layer between which the passageway structure is positioned without being in electrical contact with either, and further comprising a plurality of interconnection conductors each being adjacent to a passageway structure in the plurality thereof and being in electrical contact with that n-type layer and that p-type layer between which that passageway structure is positioned without being in electrical contact with that passageway structure, such contact providing the electrical connection between the facing sides of the layers.

4. The device of claim 1 wherein the passageways through each of the plurality of passageway structures extend in directions parallel to one another.

5. The device of claim 1 wherein the passageways through some of the plurality of passageway structures extend in directions perpendicular to the directions of extent of the passageways through at least one other of the plurality of passageway structures.

6. The device of claim 1 wherein the thermoelectric effects materials based energy transduction device is a first device; and further comprising another thermoelectric effects materials based energy transduction device as a second device comprising a second plurality of n-type layers each formed of n-type electrical conductivity material and each having thermoelectric effects properties, a second plurality of p-type layers each formed of p-type electrical conductivity material and each having thermoelectric effects properties with the second plurality of p-type layers being interleaved in spatial positions with the second plurality of n-type layers along a spatial curve to form a second spatial position sequence of these layers, and with a corresponding passageway structure from the first plurality thereof positioned between, and so as to have the passageways therethrough between, members of each overlapped pair of succeeding layers in the second spatial position sequence thereof, and a second plurality of electrical conductors with a corresponding electrical conductor from the second plurality of electrical conductors in direct electrical and physical contact with the facing sides of both members of each overlapped pair of succeeding layers in the second spatial position sequence of layers, the sides of both members facing directly across the passageway structure from each other; the second plurality of electrical conductors are the first plurality of passageway structures or a plurality of electrical conductors separate from the first plurality of passageway structures.

7. The device of claim 1 wherein the thermoelectric effects materials based energy transduction device is a first device and the first plurality of passageway structures therein is a set of passageway structures formed of a pair of subsets of those passageway structures; and further comprising another thermoelectric effects materials based energy transduction device as a second device comprising a second plurality of n-type layers each formed of n-type electrical conductivity material and each having thermoelectric effects properties, a second plurality of p-type layers each formed of p-type electrical conductivity material and each having thermoelectric effects properties with the second plurality of p-type layers being interleaved in spatial positions with the second plurality of n-type layers along a spatial curve to form a second spatial position sequence of these layers, and with a passageway structure from one of the subsets in the first plurality thereof positioned between, and so as to have the passageways therethrough between, layers in the second spatial position sequence thereof, and a second plurality of electrical conductors with a corresponding electrical conductor from the second plurality of electrical conductors in direct electrical and physical contact with the facing sides of both members of each overlapped pair of succeeding layers in the second spatial position sequence of layers, the sides of both members facing directly across the passageway structure from each other; the second plurality of electrical conductors are the one of the subsets in the first plurality of passageway structures or a plurality of electrical conductors separate from the first plurality of passageway structures.

8. The device of claim 1 wherein the thermoelectric effects materials based energy transduction device is a first device; and further comprising another thermoelectric effects materials based energy transduction device as a second device comprising a second plurality of n-type layers each formed of n-type electrical conductivity material and each having thermoelectric effects properties, a second plurality of p-type layers each formed of p-type electrical conductivity material and each having thermoelectric effects properties with the second plurality of p-type layers being interleaved in spatial positions with the second plurality of n-type layers along a spatial curve to form a second spatial position sequence of these layers, and a second plurality of passageway structures each being thermally conductive and each having passageways therethrough extending between two sides thereof with a corresponding passageway structure from this second plurality thereof positioned between, and so as to have the passageways therethrough between, members of each overlapped pair of succeeding layers in the second spatial position sequence thereof, and a second plurality of electrical conductors with a corresponding electrical conductor from this second plurality of electrical conductors in direct electrical and physical contact with the facing sides of both members of each overlapped pair of succeeding layers in the second spatial position sequence of layers, the sides of both members facing directly across the passageway structure from each other; the second plurality of electrical conductors are the second plurality of passageway structures or a plurality of electrical conductors separate from the second plurality of passageway structures.

9. The device of claim 6 wherein electrical insulating elements are positioned between at least some pairs of layers in the first and second spatial position sequences thereof with a member of each those pairs from a corresponding one of those sequences.

10. The device of claim 6 wherein the first device has a first device pair of electrodes with the first spatial position sequence electrically connected therebetween and the second has a second device pair of electrodes with the second spatial position sequence electrically connected therebetween, and with a member of each of the first and second device pairs of electrodes electrically connected to one another along with the remaining members having a selected one of an electrical energy source and an electrical power dissipating load electrically connected therebetween.

11. The device of claim 6 wherein the first device has a first device pair of electrodes with the first spatial position sequence electrically connected therebetween and the second has a second device pair of electrodes with the second spatial position sequence electrically connected therebetween, and with each member of each of the first and second device pairs of electrodes electrically connected to a corresponding member of the other along with each member of each of the first and second device pairs of electrodes also having a selected one of an electrical energy source and an electrical power dissipating load electrically connected therebetween.

12. The device of claim 7 wherein electrical insulating elements are positioned between at least some pairs of layers in the first and second spatial position sequences thereof with a member of each those pairs from a corresponding one of those sequences.

13. The device of claim 7 wherein the first device has a first device pair of electrodes with the first spatial position sequence electrically connected therebetween and the second has a second device pair of electrodes with the second spatial position sequence electrically connected therebetween, and with a member of each of the first and second device pairs of electrodes electrically connected to one another along with the remaining members having a selected one of an electrical energy source and an electrical power dissipating load electrically connected therebetween.

14. The device of claim 7 wherein the first device has a first device pair of electrodes with the first spatial position sequence electrically connected therebetween and the second has a second device pair of electrodes with the second spatial position sequence electrically connected therebetween, and with each member of each of the first and second device pairs of electrodes electrically connected to a corresponding member of the other along with each member of each of the first and second device pairs of electrodes also having a selected one of an electrical energy source and an electrical power dissipating load electrically connected therebetween.

15. The device of claim 8 wherein electrical insulating elements are positioned between at least some pairs of layers in the first and second spatial position sequences thereof with a member of each those pairs from a corresponding one of those sequences.

16. The device of claim 8 wherein the first device has a first device pair of electrodes with the first spatial position sequence electrically connected therebetween and the second has a second device pair of electrodes with the second spatial position sequence electrically connected therebetween, and with a member of each of the first and second device pairs of electrodes electrically connected to one another along with the remaining members having a selected one of an electrical energy source and an electrical power dissipating load electrically connected therebetween.

17. The device of claim 8 wherein the first device has a first device pair of electrodes with the first spatial position sequence electrically connected therebetween and the second has a second device pair of electrodes with the second spatial position sequence electrically connected therebetween, and with each member of each of the first and second device pairs of electrodes electrically connected to a corresponding member of the other along with each member of each of the first and second device pairs of electrodes also having a selected one of an electrical energy source and an electrical power dissipating load electrically connected therebetween.

18. A method of selectively providing conversions between electrical and thermal energies using a thermoelectric effects materials based energy transduction device comprising a first plurality of n-type layers each formed of n-type electrical conductivity material and each having thermoelectric effects properties and a first plurality of p-type layers each formed of p-type electrical conductivity material and each having thermoelectric effects properties with the first plurality of p-type layers being interleaved in spatial positions with the first plurality of n-type layers along a spatial curve to form a first spatial position sequence of these layers, and having a first plurality of passageway structures together as a set with each being formed of thermally conductive separators adjacent to passageways through the passageway structures extending between two sides of the passageway structures and with a corresponding one of the passageway structures having a separator in that passageway structure extending across the passageway structure to be positioned between, and in thermal contact with, facing sides of both members of each overlapped pair of succeeding layers in the first spatial position sequence of layers to be in a continuous conductive thermal connection between these succeeding layers and to provide the corresponding passageway structure with passageways extending both between the two sides of that structure; and a first plurality of electrical conductors with a corresponding electrical conductor from this first plurality of electrical conductors in direct electrical and physical contact with the facing sides of both members of each overlapped pair of succeeding layers in the first spatial position sequence of layers, the sides of both members facing directly across the passageway structure from each other; the first plurality of electrical conductors are the first plurality of passageway structures or a plurality of electrical conductors separate from the first plurality of passageway structures; there being a pair of electrodes having the first spatial position sequence electrically connected between them, the method comprising:
  electrically connecting a selected one of an electrical energy source and an electrical power dissipating load between the pair of electrodes;
  forcing a fluid to flow through the passageways of every other one of the first plurality of passageway structures positioned along the first spatial position sequence of layers as a first subset of the set of passageway structures; and
  forcing a fluid to flow through the passageways of the remaining ones of the first plurality of passageway structures positioned along the first spatial position sequence of layers as a second subset of the set of passageway structures;
  wherein all fluid flowing through passageways of a passageway structure flows in a single direction.

19. The method of claim 18 wherein the passageways through each of the plurality of passageway structures extend in directions parallel to one another.

20. The method of claim 18 wherein the passageways through some of the plurality of passageway structures extend in directions perpendicular to the directions of extent of the passageways through at least one other of the plurality of passageway structures.

21. A device for selectively electrically heating a first flow of fluid and cooling a second flow of fluid; or generating electrical energy from a heated flow of fluid and a cooled flow of fluid, the device comprising:
- a plurality of n-type layers formed of n-type semiconductor material;
- a plurality of p-type layers formed of p-type semiconductor material interleaved with the plurality of n-type layers;
- a plurality of passageway structure layers interleaved between adjacent interleaved n-type and p-type layers, each passageway structure layer being configured to confine a single flow of fluid through the passageway structure layer; and including thermally conductive separators that are in direct thermal contact with facing sides of the n-type layer and the p-type layer adjacent to the passageway structure layer and that define individual passageways within each passageway structure layer; and
- a plurality of electrical conductors, each in direct electrical and physical contact with the facing sides of the n-type layer and the p-type layer adjacent to a corresponding passageway structure layer, the plurality of electrical conductors are the plurality of passageway structures or a plurality of electrical conductors separate from the plurality of passageway structures.

22. The device of claim 21 wherein the plurality electrical conductors are the plurality of passageway structures.

23. The device of claim 21 wherein the passageway structure layers are electrically conductive, and electrically isolated from the facing sides of the n-type layer and the p-type layer adjacent each passageway structure layer.

* * * * *